US011929592B2

(12) United States Patent
He et al.

(10) Patent No.: US 11,929,592 B2
(45) Date of Patent: Mar. 12, 2024

(54) SILICON-PHOTONICS-BASED SEMICONDUCTOR OPTICAL AMPLIFIER WITH N-DOPED ACTIVE LAYER

(71) Applicant: MARVELL ASIA PTE LTD., Singapore (SG)

(72) Inventors: Xiaoguang He, Diamond Bar, CA (US); Radhakrishnan L. Nagarajan, Santa Clara, CA (US)

(73) Assignee: Marvell Asia Pte Ltd., Singapore (SG)

( * ) Notice: Subject to any disclaimer, the term of this patent is extended or adjusted under 35 U.S.C. 154(b) by 102 days.

(21) Appl. No.: 17/024,473

(22) Filed: Sep. 17, 2020

(65) Prior Publication Data
US 2022/0085575 A1    Mar. 17, 2022

(51) Int. Cl.
| H01S 5/30 | (2006.01) |
| H01S 5/02 | (2006.01) |
| H01S 5/026 | (2006.01) |
| H01S 5/028 | (2006.01) |
| H01S 5/068 | (2006.01) |

(Continued)

(52) U.S. Cl.
CPC ............. *H01S 5/309* (2013.01); *H01S 5/026* (2013.01); *H01S 5/028* (2013.01); *H01S 5/0287* (2013.01); *H01S 5/068* (2013.01); *H01S 5/142* (2013.01); *H01S 5/50* (2013.01); *H01S 5/021* (2013.01);

(Continued)

(58) Field of Classification Search
CPC ........ H01S 5/3407; H01S 5/309; H01S 5/021; H01S 5/0218; H01S 5/141–143
See application file for complete search history.

(56) References Cited

U.S. PATENT DOCUMENTS

| 4,163,238 A | * | 7/1979 | Esaki | ............... B82Y 20/00 |
| | | | | 257/17 |
| 4,881,235 A | * | 11/1989 | Chinone | ............ B82Y 20/00 |
| | | | | 372/45.01 |

(Continued)

FOREIGN PATENT DOCUMENTS

| CN | 102405570 A | * | 4/2012 | ........... H01S 5/0687 |
| CN | 104966989 A | * | 10/2015 | ............... H01S 5/06 |

(Continued)

OTHER PUBLICATIONS

Extended European Search Report corresponding to European Application No. 21197432.4 dated Feb. 10, 2022, 13 pages.

(Continued)

*Primary Examiner* — Joshua King

(57) ABSTRACT

A semiconductor optical amplifier for high-power operation includes a gain medium having a multilayer structure sequentially laid with a P-layer, an active layer, a N-layer from an upper portion to a lower portion in cross-section thereof. The gain medium is extendedly laid with a length L from a front facet to a back facet. The active layer includes multiple well layers formed by undoped semiconductor material and multiple barrier layers formed by n-doped semiconductor materials. Each well layer is sandwiched by a pair of barrier layers. The front facet is characterized by a first reflectance Rf and the back facet is characterized by a second reflectance Rb. The gain medium has a mirror loss $\alpha_m$ about 40-200 cm$^{-1}$ given by: $\alpha_m=(½L)\ln\{1/(Rf\times Rb)\}$.

23 Claims, 5 Drawing Sheets

(51) Int. Cl.
*H01S 5/10* (2021.01)
*H01S 5/14* (2006.01)
*H01S 5/50* (2006.01)

(52) U.S. Cl.
CPC ............ *H01S 5/0218* (2013.01); *H01S 5/101* (2013.01); *H01S 5/1039* (2013.01); *H01S 5/1085* (2013.01)

(56) References Cited

U.S. PATENT DOCUMENTS

| | | | | |
|---|---|---|---|---|
| 4,881,238 | A * | 11/1989 | Chinone | B82Y 20/00 372/45.01 |
| 5,102,825 | A * | 4/1992 | Brennan | H01S 5/227 148/DIG. 95 |
| 5,173,912 | A * | 12/1992 | Iwase | H01S 5/4043 372/45.01 |
| 5,392,306 | A * | 2/1995 | Usami | H01S 5/34 257/14 |
| 5,561,301 | A * | 10/1996 | Inoue | H01L 31/0352 257/17 |
| 5,793,521 | A * | 8/1998 | O'Brien | H01S 5/026 359/344 |
| 5,838,025 | A * | 11/1998 | Lealman | B82Y 20/00 257/94 |
| 6,078,602 | A * | 6/2000 | Sato | B82Y 20/00 372/45.01 |
| 6,214,178 | B1 * | 4/2001 | Chakrabarti | H01S 5/028 216/66 |
| 6,249,373 | B1 * | 6/2001 | Woodward | H01S 5/50 359/344 |
| 6,396,861 | B1 * | 5/2002 | Shimizu | H01S 5/34 372/45.01 |
| 6,434,178 | B1 * | 8/2002 | Ubukata | H01S 5/34 372/45.01 |
| 6,512,629 | B1 * | 1/2003 | Dijaili | H01S 5/5027 359/344 |
| 7,183,584 | B2 * | 2/2007 | Futagawa | B82Y 20/00 257/14 |
| 9,653,882 | B1 * | 5/2017 | Zheng | H01S 5/142 |
| 9,735,542 | B2 * | 8/2017 | Li | H01S 5/1032 |
| 9,780,528 | B1 * | 10/2017 | Zheng | H01S 5/1071 |
| 9,871,346 | B1 * | 1/2018 | Lee | H01S 5/0687 |
| 9,882,349 | B1 * | 1/2018 | Krishnamoorthy | H01S 5/142 |
| 10,680,410 | B2 * | 6/2020 | Ma | H01S 5/142 |
| 2004/0099859 | A1 * | 5/2004 | Nakahara | B82Y 20/00 257/14 |
| 2005/0025199 | A1 * | 2/2005 | Ma | H01S 5/141 372/20 |
| 2005/0047727 | A1 * | 3/2005 | Shin | H01S 5/14 385/88 |
| 2005/0156153 | A1 * | 7/2005 | Futagawa | H01S 5/34333 257/14 |
| 2008/0175549 | A1 * | 7/2008 | Uetake | B82Y 20/00 257/E21.04 |
| 2009/0122817 | A1 * | 5/2009 | Sato | G02B 6/12007 372/20 |
| 2009/0274187 | A1 * | 11/2009 | Kudo | H01S 5/026 372/50.1 |
| 2009/0324163 | A1 * | 12/2009 | Dougherty | G02B 6/1228 385/14 |
| 2010/0032646 | A1 * | 2/2010 | Tanaka | H01L 33/06 977/755 |
| 2011/0064101 | A1 * | 3/2011 | Raring | H01L 21/02389 257/15 |
| 2012/0099185 | A1 * | 4/2012 | Yokoyama | H01S 5/0657 372/18 |
| 2012/0189025 | A1 * | 7/2012 | Zheng | H01S 5/1071 372/20 |
| 2015/0207296 | A1 * | 7/2015 | Rickman | H01S 5/021 372/20 |
| 2015/0215043 | A1 * | 7/2015 | Debregeas | H04J 14/02 398/79 |
| 2015/0222089 | A1 * | 8/2015 | Jeong | H01S 5/14 359/346 |
| 2016/0156149 | A1 * | 6/2016 | Takabayashi | H01S 5/142 372/6 |
| 2017/0040775 | A1 * | 2/2017 | Takabayashi | H01S 5/50 |
| 2017/0139237 | A1 * | 5/2017 | Luo | G02F 1/011 |
| 2017/0163001 | A1 * | 6/2017 | Evans | H01S 5/06256 |
| 2017/0207600 | A1 * | 7/2017 | Klamkin | H01S 5/1032 |
| 2017/0324218 | A1 * | 11/2017 | Krishnamoorthy | H01S 3/10069 |
| 2017/0353008 | A1 * | 12/2017 | Sugiyama | H01S 5/142 |
| 2017/0353011 | A1 * | 12/2017 | Kawakita | H01S 5/309 |
| 2018/0143461 | A1 * | 5/2018 | Zheng | H01S 5/125 |
| 2018/0159293 | A1 * | 6/2018 | Bovington | H04B 10/572 |
| 2018/0269654 | A1 * | 9/2018 | Zhang | H01S 5/021 |
| 2019/0058306 | A1 * | 2/2019 | Wen | H01S 5/142 |
| 2020/0067276 | A1 * | 2/2020 | Ma | H01S 5/1025 |
| 2020/0280173 | A1 * | 9/2020 | Gao | H01S 5/02415 |

FOREIGN PATENT DOCUMENTS

| | | | | |
|---|---|---|---|---|
| CN | 106785882 | A * | 5/2017 | |
| CN | 110459956 | A * | 11/2019 | .......... G02B 6/4204 |
| CN | 111244758 | A * | 6/2020 | |
| EP | 0405801 | A2 * | 1/1991 | |
| EP | 0895326 | A1 * | 2/1999 | |
| JP | H07122812 | A * | 5/1995 | |
| JP | 3461893 | B2 * | 10/2003 | ............ B82Y 20/00 |
| JP | 2010177539 | A * | 8/2010 | |
| JP | 2017098362 | A * | 6/2017 | |
| WO | WO-2006006249 | A1 * | 1/2006 | ............ G02F 2/004 |
| WO | WO-2007080891 | A1 * | 7/2007 | ............ H01S 5/026 |
| WO | WO-2013021422 | A1 * | 2/2013 | ......... G02B 6/12007 |
| WO | WO-2013145271 | A1 * | 10/2013 | ......... G02B 6/12004 |
| WO | WO-2013167709 | A1 * | 11/2013 | ............ H01S 5/0265 |
| WO | WO-2017200620 | A2 * | 11/2017 | ............ H01S 5/021 |
| WO | WO-2018103004 | A1 * | 6/2018 | ......... H01S 5/0687 |
| WO | WO-2018131227 | A1 * | 7/2018 | ............ G02F 1/017 |
| WO | WO-2019191647 | A1 * | 10/2019 | .......... G02F 1/3536 |
| WO | WO-2019195988 | A1 * | 10/2019 | ............ H01S 5/026 |

OTHER PUBLICATIONS

Lei Po-Hsun et al: "Effects of n-type modulation-doping barriers and a linear graded-composition GaInAsP intermediate layer on the 1.3[mu]m AlGaInAs/AlGaInAs strain-compensated multiple-quantum-well laser diodes", Journal of Vacuum Science and Technology: Part B, AVS / AIP, Melville, New York, NY, US, vol. 24, No. 2, Feb. 23, 2006 (Feb. 23, 2006), pp. 623-628.

Feng DJ et al: "Modulation-Doped InGaAiAs/InP Semiconductor Optical Amplifier Structures Grown by Molecular Beam Epitaxy", Japanese Journal of Applied Physics, Japan Society of Applied Physics, JP, vol. 45, No. 4A, Apr. 1, 2006 (Apr. 1, 2006), pp. 2426-2425.

Lei Po-Hsun et al: "1.3 [mu]m InAsP multiquantum well laser diodes with the n-type modulation-doped InAsP/InP/InGaP active region", Journal of Vacuum Science and Technology: Part B, AVS / AIP, Melville, New York, NY, US, vol. 20, No. 3, May 1, 2002 (May 1, 2002), pp. 1013-1018.

* cited by examiner

SILICON-PHOTONICS-BASED SEMICONDUCTOR OPTICAL AMPLIFIER WITH N-DOPED ACTIVE LAYER

BACKGROUND OF THE INVENTION

The present invention relates to optical telecommunication techniques. More particularly, the present invention provides a semiconductor optical amplifier in silicon photonics platform for high-power elevated temperature operation.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

40-Gbit/s and then 100-Gbit/s data rates wide-band DWDM (Dense Wavelength Division Multiplexed) optical transmission over existing single-mode fiber is a target for the next generation of fiber-optic communication networks. More recently, optical components are being integrated on silicon substrates for fabricating large-scale photonic integrated circuits that co-exist with micro-electronic chips. a whole range of photonic components, including filters, (de)multiplexers, splitters, modulators, and photodetectors, have been demonstrated, mostly in the silicon-photonics platform. The silicon-photonics platform on silicon-on-insulator substrate is especially suited for standard WDM communication bands at 1300 nm and 1550 nm, as silicon (n=3.48) and its oxide $SiO_2$ (n=1.44) are both transparent, and form high-index contrast, high-confinement waveguides ideally suited for medium to high-integration silicon photonics integrated circuits (SPICs).

Semiconductor optical amplifier in silicon photonics platform have been implemented for many applications of optical telecommunication. For example, wavelength tunable laser based on the semiconductor optical amplifier is provided as key elements in SPICs for wide-band optical communication with increasing spectral efficiency. However, technical challenges exist for developing high-power semiconductor optical amplifier (SOA) or reflective semiconductor optical amplifier (RSOA) for elevated temperature operation in wide-band high-speed data communication application. Therefore, improved techniques are desired.

BRIEF SUMMARY OF THE INVENTION

The present invention relates to optical telecommunication techniques. One aspect of the present invention provides a reflective semiconductor optical amplifier (RSOA) and/or a semiconductor optical amplifier (SOA) for tunable lasers with high-power in elevated temperature operation. More particularly, the present invention provides a gain medium having a n-type doped active layer applied in RSOA/SOA to provide high saturation power at elevated temperature for making a wide-band wavelength tunable laser in high-speed data communication application, though other applications are possible.

In an embodiment, the present invention provides a semiconductor optical amplifier for high-power operation. The semiconductor optical amplifier includes a gain medium including a multilayer structure sequentially laid with a P-layer, an active layer, a N-layer from an upper portion to a lower portion in cross-section thereof and extendedly laid with a length L from a front facet to a back facet thereof. The active layer comprises multiple well layers formed by undoped semiconductor material and multiple barrier layers formed by n-doped semiconductor materials. Each well layer is sandwiched by a pair of barrier layers. The front facet is characterized by a first reflectance Rf and the back facet is characterized by a second reflectance Rb. The gain medium has a mirror loss $\alpha_m$ about 40-200 $cm^{-1}$ given by: $\alpha_m=(½L)\ln\{1/(Rf \times Rb)\}$.

Optionally, the gain medium is configured to produce a saturation power at least greater than 15 dBm with operation temperature up to 50° C.

Optionally, the active layer includes multiple barrier layers of a width about 5-15 nm with a bandgap of about 0.9-1.1 eV.

Optionally, each barrier layer includes a modulation doping area with n-type dopant concentration range of $1.0 \times 10^{18}$ $cm^{-3}$ to $3.0 \times 10^{18}$ $cm^{-3}$ in a width range of 7 nm to 10 nm.

Optionally, the active layer includes multiple well layers of a width about 4-8 nm with a bandgap in a corresponding amplified wavelength range. For C-band, the bandgap is about 0.8 eV.

Optionally, the gain medium has a mirror loss greater than 45-100 $cm^{-1}$ for the length L of 1 mm as the front facet is provided with an anti-reflective coating with the first reflectance Rf about 0.005% or smaller and the back facet is provided with a high-reflective coating with the second reflectance Rb greater than 90% for forming a reflective semiconductor optical amplifier.

Optionally, the gain medium is configured as an optical cavity for amplifying a stimulated emission in the active layer, wherein the stimulated emission is reflected from the back facet and emitted out the front facet.

Optionally, the active layer is made of a linear waveguide through the optical cavity, wherein the linear waveguide forms a non-perpendicular angle relative to the front facet and a substantially perpendicular angle relative to the back facet.

Optionally, the gain medium has a mirror loss greater than 90-200 $cm^{-1}$ for the length L of 1 mm as the front facet is provided with an anti-reflective coating with the first reflectance Rf about 0.005% or smaller and the back facet is provided with anti-reflective coating with the second reflectance Rb about 0.005% or smaller for forming a symmetric semiconductor optical amplifier.

Optionally, the gain medium is configured as an optical cavity for amplifying a laser light in the active layer wherein the laser light is inputted through the back facet once and emitted out the front facet.

Optionally, the active layer is made of a linear waveguide through the optical cavity, wherein the linear waveguide forms a non-perpendicular angle relative to the front facet and a non-perpendicular angle relative to the back facet.

Optionally, the P-layer comprises a p-type confinement layer attached to an upper portion of the active layer and a p-type clad layer attached to a side of the p-type confinement layer more distal to the active layer.

Optionally, the p-type confinement layer includes a first confinement sublayer of a 5-15 nm thickness with a bandgap of about 0.9-1.1 eV attached to a barrier layer with a slightly smaller bandgap of about 0.9-1.1 eV next to the upper portion of the active layer and a second confinement sublayer of a 15-25 nm thickness and a bandgap of about 1.1-1.2 eV attached to a side of the first confinement sub-layer more distal to the active layer.

Optionally, the N-layer comprises a n-type confinement layer attached to a lower portion of the active layer and a n-type clad layer attached to a side of the n-type confinement layer more distal to the active layer.

Optionally, the n-type confinement layer comprises a first confinement sublayer of a 5-15 nm thickness with a bandgap of about 0.9-1.1 eV attached to a barrier layer with a slightly smaller bandgap of about 0.9-1.1 eV next to the lower portion of the active layer and a second confinement sublayer of a 15-80 nm thickness and a bandgap of about 1.1-1.2 eV attached to a side of the first confinement sub-layer more distal to the active layer.

In an alternative embodiment, the present invention provides wavelength-tunable laser in silicon photonics platform for high-power operation. The wavelength-tunable laser includes a silicon photonics substrate. Additionally, the wavelength-tunable laser includes a first semiconductor optical amplifier as described herein on the silicon photonics substrate. The gain medium is configured as an optical cavity with the front facet coated an anti-reflective coating and the back facet coated a high-reflective coating to produce a laser light amplified in the active layer thereof and reflected by the back facet before passing through the front facet. The wavelength-tunable laser further includes a wavelength tuner formed in the silicon photonics substrate and configured to receive the laser light via a first waveguide and tune wavelength of the laser light in a range of a wide-band. Furthermore, the wavelength-tunable laser includes a wavelength locker formed in the silicon photonics substrate and configured to couple with the wavelength tuner and lock the wavelength of the laser light and deliver the laser light via a second waveguide. Moreover, the wavelength-tunable laser includes a second semiconductor optical amplifier as described herein on the silicon photonics substrate. The gain medium is configured as an optical cavity with the front facet coated an anti-reflective coating and the back facet coated an anti-reflective coating, the laser light being inputted through the back facet and amplified in the active layer thereof before outputting through the front facet.

Optionally, the active layer in the gain medium of the first semiconductor optical amplifier comprises multiple well layers formed by undoped semiconductor material in 6 nm thickness with a bandgap in a corresponding amplified wavelength range and multiple barrier layers formed by n-doped semiconductor materials in a doping concentration of $1.0 \times 10^{18}$ cm$^{-3}$ to $3.0 \times 10^{18}$ cm$^{-3}$ in a 5-15 nm thickness with a bandgap of 0.9-1.1 eV. Each well layer is sandwiched by a pair of barrier layers.

Optionally, the active layer in the gain medium of the second semiconductor optical amplifier comprises multiple well layers formed by undoped semiconductor material in a 4-8 nm thickness with a bandgap in a corresponding amplified wavelength range and multiple barrier layers formed by n-doped semiconductor materials in a doping concentration of $1.0 \times 10^{18}$ cm$^{-3}$ to $3.0 \times 10^{18}$ cm$^{-3}$ in a 5-15 nm thickness with a bandgap of 0.9-1.1 eV; each well layer being sandwiched by a pair of barrier layers.

Optionally, the gain medium of the first semiconductor optical amplifier has a mirror loss of about 45-100 cm$^{-1}$ for a length of 1 mm; the gain medium of the second semiconductor optical amplifier has a mirror loss of about 90-200 cm$^{-1}$ for a length of 1 mm.

Optionally, the gain medium of the first semiconductor optical amplifier is configured to produce a saturation laser power of at least 15 dBm at an elevated operation temperature 50° C. and the gain medium of the second semiconductor optical amplifier is configured to produce a maximum light power of at least 15 dBm at an elevated operation temperature 50° C.

The present invention achieves these benefits and others in the context of known technology of semiconductor optical amplifier, optionally provided with a gain medium including a modulated n-doped active layer between a PN junction in waveguide form extended in a length from a front facet and a back facet. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

The present invention relates to optical telecommunication techniques. One aspect of the present invention provides a reflective semiconductor optical amplifier (RSOA) and/or a semiconductor optical amplifier (SOA) with high-power gain medium for elevated-temperature operation. More particularly, the present invention provides RSOA/SOA with n doped active layer for making a wide-band wavelength-tunable laser in high-speed data communication application, though other applications are possible.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels inner, outer, left, right, front, back, top, bottom, end, forward, reverse, clockwise and counter clockwise have been used for convenience purposes only and are not intended to imply any particular fixed direction. Instead, they are used to reflect relative locations and/or directions between various portions of an object.

Figure 1:
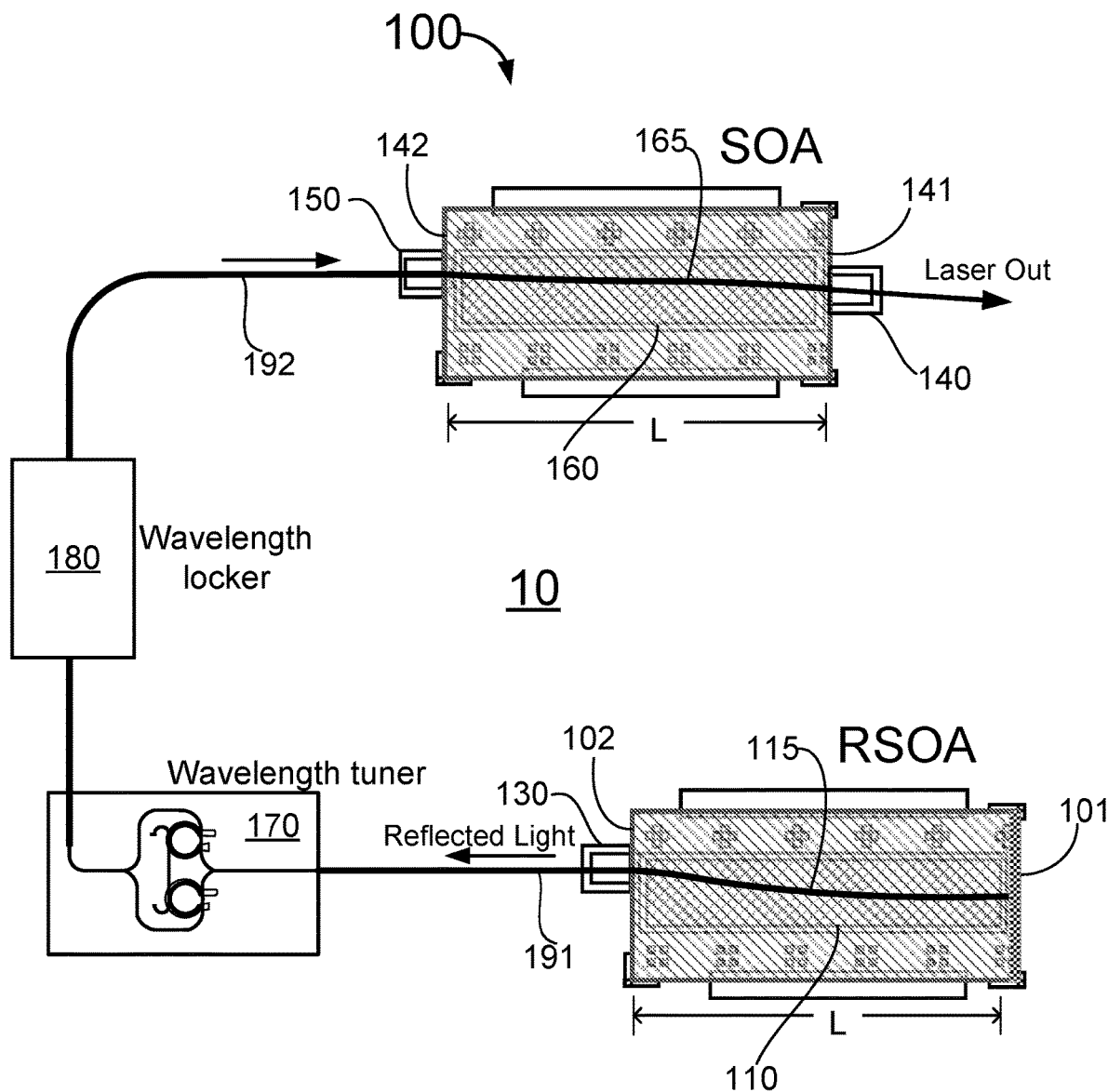
FIG. 1 is a schematic diagram of a tunable laser based on a reflective semiconductor optical amplifier (RSOA) combined with a semiconductor optical amplifier (SOA) according to an embodiment of the present invention.

In an aspect, the present disclosure provides a reflective semiconductor optical amplifier (RSOA) and/or a semiconductor optical amplifier (SOA) with high-power operability at elevated temperature. In an example, the RSOA/SOA with high-power operability is applied to form a wide-band wavelength tunable laser in silicon photonics platform. FIG. 1 is a schematic diagram of a tunable laser based on a reflective semiconductor optical amplifier (RSOA) combined with a semiconductor optical amplifier (SOA) according to an embodiment of the present invention. This diagram is merely an example, which should not unduly limit the scope of the claims. One of ordinary skill in the art would recognize many variations, alternatives, and modifications. As shown, the tunable laser module 100 includes a RSOA with a first gain medium 110 on a silicon photonics substrate 10 to generate a stimulated emission, a wavelength tuner 170 formed in the silicon photonics substrate 10 and coupled to the RSOA to receive a reflected light in a wide band tuned based on the stimulated emission, a wavelength locker 180 formed in the silicon photonics substrate 10 and coupled to the wavelength tuner 170 to lock wavelengths of the light, and a SOA with a second gain medium 160 in an output path coupled to the wavelength locker to pass the light with a single amplification in power.

Optionally, the first gain medium 110 of RSOA is a laser chip flip-bonded on the silicon photonics substrate 10. The laser chip includes an active region 115 capped in a clad region configured in a waveguide form along its length throughout an optical cavity having a length L from a back facet 101 to a front facet 102, within which a stimulated emission or laser light is generated. The front facet 102 is characterized by a first reflectance Rf and the back facet 101 is characterized by a second reflectance Rb. Optionally, the first reflectance Rf is very low in value, e.g., 0.005%, provided by an anti-reflective coating on the front facet 102. Optionally, the second reflectance Rb is very high in value, e.g., >90%, provided by a high-reflective coating on the back facet 101. Optionally, the active region 115 in waveguide form is configured to be in a curved shape with a non-perpendicular angle relative to the front facet 102 to reduce direct back reflection of the light thereby but with a substantially perpendicular angle relative to back facet 101 to maximize the reflection. The laser light is reflected by the back facet 101 and emitted out through the front facet 102 into a first waveguide 191 via a coupler 130. Through the first waveguide 191 the laser light is delivered to the wavelength tuner 170. In an embodiment for the tunable laser in high-power operation, the first gain medium 110 of RSOA is configured in a laser-diode chip to yield a high saturation power $P_{sat}$ at elevated temperature by design. The high saturation power means that the RSOA is configured to produce a high stable laser power. Yet, the higher saturation power can be achieved by using a low driving current with a shorter cavity to keep the gain high enough in order for it to operate at elevated temperature of ~50° C. with a saturation power higher than 15 dBm.

Referring to FIG. 1, the laser light, after passing through the wavelength tuner 170 and wavelength locker 180, with its wavelength locked in a specific value in a wide-band spectrum (such as C-band), is inputted via an input coupler 150 in the SOA where it is further amplified in power before being outputted via an output coupler 140. Optionally, the second gain medium 160 of SOA is another laser chip flip-bonded on the silicon photonics substrate 10. The gain medium 160 includes a gain region 165 capped in a clad region configured in a waveguide form extended in a length L through an amplifying cavity from a back facet 142 coupled to the input coupler 150 and a front facet 141 coupled to the output coupler 140. In the embodiment, the front facet 141 is characterized by a first reflectance Rf and the back facet 142 is characterized by a second reflectance Rb. Optionally, both the back facet 142 and the front facet 141 are coated by anti-reflective coating to give a very low value, e.g., 0.005%, of the first reflectance Rf and the second reflectance Rb for forming a symmetric semiconductor optical amplifier to allow the light to pass through once and be amplified in power. Optionally, the active region 165 in waveguide form is configured to be in a curved shape with a non-perpendicular angle relative to either the back facet 142 or the front facet 141 to reduce direct back reflection of the light thereby. This light received via the back facet 142 from the input coupler 150 is simply passed through the length L of the cavity and amplified therein before outputting via the front facet 141. In the embodiment, for making the tunable laser in high-power operation, the second gain medium 160 of SOA can be also configured in a chip to yield a high saturation output power $P_{sat}$>15 dBm by design, meaning to have a high amplified maximum output power at elevated temperature of about 50° C.

In theory, the saturation output power $P_{sat}$ of a gain medium or a laser-diode chip can be expressed as following:

$$P_{sat}^c = \left(\frac{dw}{\Gamma}\right)\left(hv\frac{1}{a}\frac{1}{\tau_s}\right). \tag{1}$$

In the expression (1), d is a thickness of an active layer of the gain medium, w is a width of the active layer, Γ is optical confinement factor, a is a differential gain, and $\tau_s$ is carrier lifetime. Conventional methods have been used to improve $P_{sat}$ by increasing the width w of the active layer or reducing optical confinement factor Γ (or increasing ratio of d/Γ). Downside of reduced confinement factor or wider emitter is the gain is also reduced. In order to obtain higher gain for the device, longer cavity length and higher operating current are normally required to achieve high power. But high operating current mostly is not recommended for device in elevated temperature operation.

Figure 2:
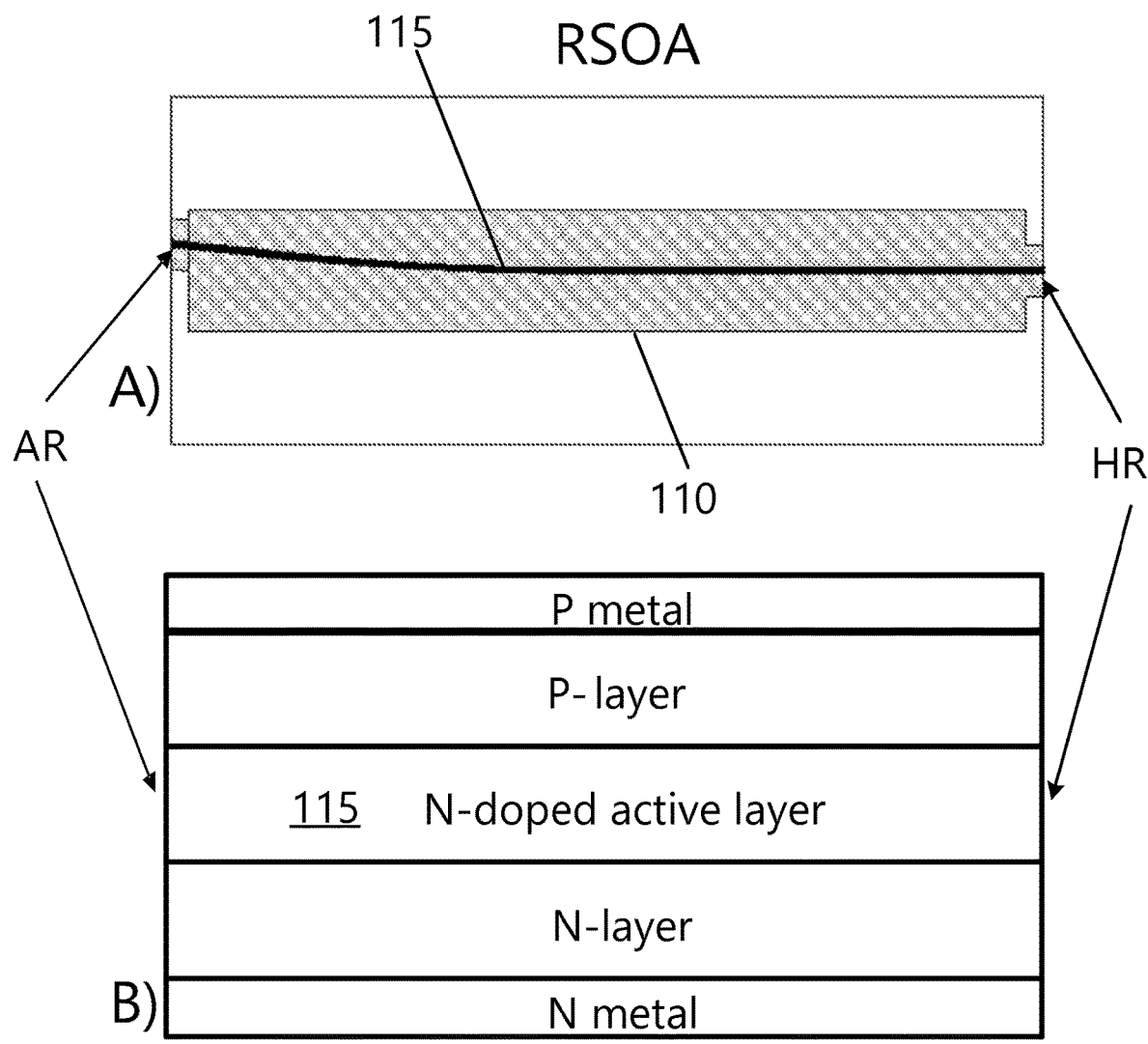
FIG. 2 is a schematic diagram of a RSOA with a gain medium in both top and side views according to an embodiment of the present invention.

The present disclosure provides an improved SOA (or RSOA) with high saturation power $P_{sat}$ for elevated temperature operation with reasonably high gain but reduced carrier lifetime $\tau_s$ and differential gain a by providing a gain medium with n-doped active layer in the gain chip for the SOA or RSOA. FIG. 2 is a schematic diagram of a RSOA with a gain medium in both top and side views according to an embodiment of the present invention. This diagram is merely an example, which should not unduly limit the scope of the claims. One of ordinary skill in the art would recognize many variations, alternatives, and modifications. As shown in part A), a top view of the gain medium 110 of the RSOA reveals a linear active region 115 laid in an optical cavity between a front facet with anti-reflective (AR) coating and a back facet with high-reflective (HR) coating. In part B) of FIG. 2, a cross-section side view of the main medium 110 reveals a multi-layer structure with the active region 115 is shown as an active layer in a central portion of the multi-layer structure sandwiched between a P-layer at upper portion and a N-layer at lower portion which forms a semiconductor diode with a p-type electrode (p-metal) on the P-layer at the upper portion and a n-type electrode (n-metal) beneath the N-layer at the lower portion. Note, the terms of upper or lower merely are referred to the figure illustration and do not limit actual device in just one setting in orientation. Optionally, the P-layer includes a p-type optical confinement layer and a p-type clad layer. Optionally, there is a contact layer between the P-layer and the p-metal. Optionally, the N-layer includes a n-type optical confinement layer and a n-type clad layer. Optionally, the N-layer is formed on a substrate and the n-metal is formed at a back side of the substrate. Optionally, the semiconductor diode is configured as a laser diode with the optical cavity between the front facet and the back facet for RSOA.

When the laser diode is driven by a current source across the p-type electrode and the n-type electrode, a carrier-stimulated emission in the active layer 115 is generated between the front facet and the back facet before lasing out the front facet. Optionally, the active layer 115 is provided as a n-doped layer to increase carrier density and reduces the carrier lifetime significantly. Optionally, the active layer 115 itself is also a multilayer structure configured to form a multi-quantum-well structure. Depending on working wavelength spectrum, different semiconductor materials including one or more compound semiconductors or a combination of InAsP, GaInNAs, GaInAsP, GaInAs, and AlGaInAs may be employed for forming the multi-layers in the active layer with multi-quantum-well structure. Optionally, the n-type dopant for the active layer 115 can be Si or Se. Optionally, the doping concentration can be in a range of $1.0 \times 10^{18}$ cm$^{-3}$ to $3.0 \times 10^{18}$ cm$^{-3}$.

Although P-doped active layer may be employed to reduce the carrier lifetime but it also causes high differential gain. Thus, p-doped active layer is not a good solution for improving Psat of RSOA by reducing differential gain.

Figure 3:
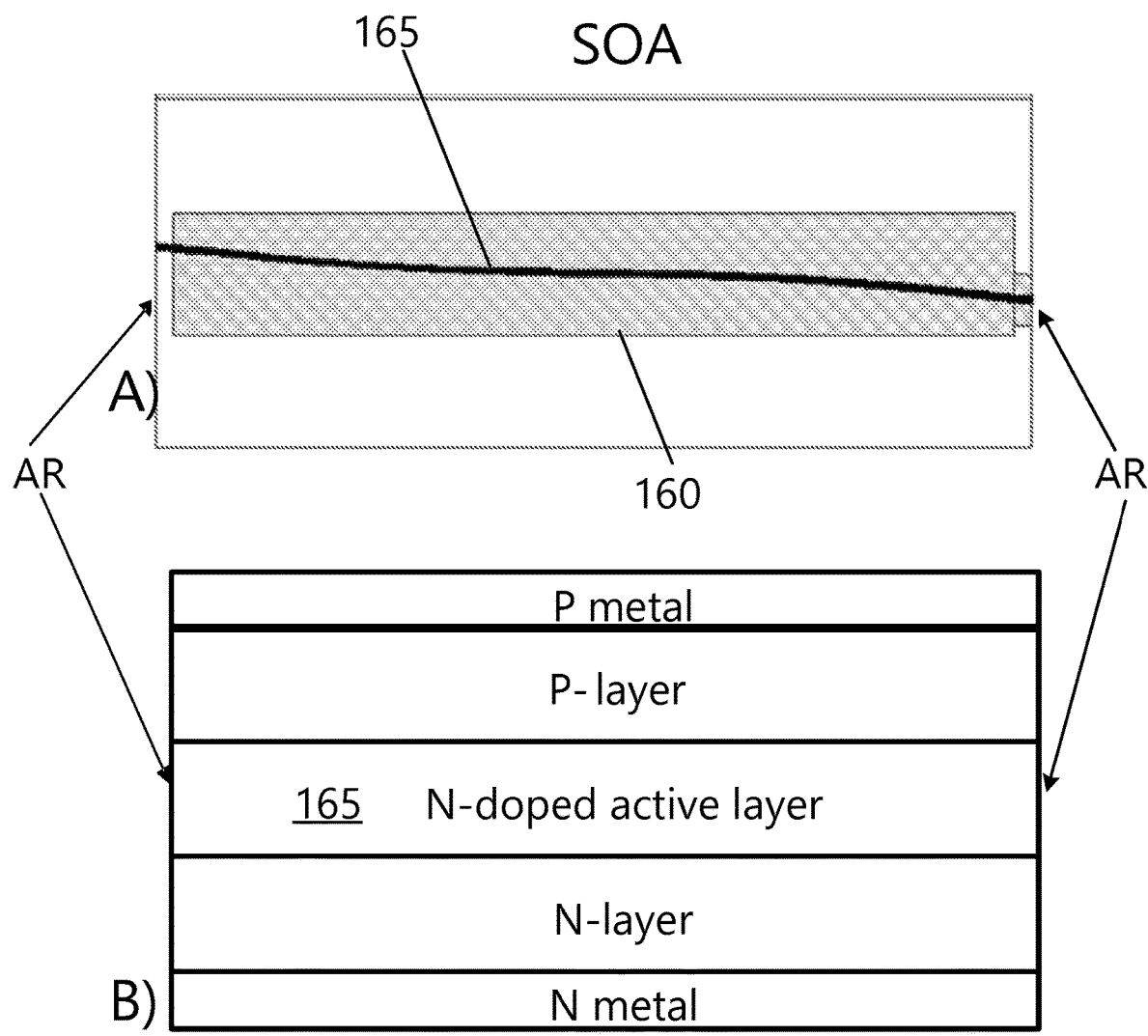
FIG. 3 is a schematic diagram of a SOA with a gain medium in both top and side views according to an embodiment of the present invention.

FIG. 3 is a schematic diagram of a SOA with a gain medium in both top and side views according to an embodiment of the present invention. This diagram is merely an example, which should not unduly limit the scope of the claims. One of ordinary skill in the art would recognize many variations, alternatives, and modifications. In an embodiment, the gain medium for SOA can be substantially same as the gain medium for RSOA described above in FIG. 2. Similarly, in Part A), a top view of the gain medium 160 of the SOA reveals a linear active region 165 laid in a cavity between a back facet and a front facet both with anti-reflective coating. In part B) of FIG. 3, a cross-section side view of the main medium 160 reveals a multi-layer structure with the active region 165 is shown as an active layer in a central portion of the multi-layer structure sandwiched between a P-layer at upper portion and a N-layer at lower portion which forms a semiconductor diode with a p-type electrode (p-metal) on the P-layer at the upper portion and a n-type electrode (n-metal) beneath the N-layer at the lower portion. Note, the terms of upper or lower merely are referred to the figure illustration and do not limit actual device in just one setting in orientation. Optionally, the P-layer includes a p-type optical confinement layer and a p-type clad layer. Optionally, there is a contact layer between the P-layer and the p-metal. Optionally, the N-layer includes a n-type optical confinement layer and a n-type clad layer. Optionally, the N-layer is formed on a substrate and the n-metal is formed at a back side of the substrate. Optionally, the semiconductor diode is configured as a laser diode with the optical cavity between the back facet and the front facet for SOA.

Optionally, the active layer 165 itself is a multilayer structure configured to form a multi-quantum-well structure or a hetero-junction structure. Depending on working wavelength spectrum, different semiconductor materials including one or more compound semiconductors or a combination of InAsP, GaInNAs, GaInAsP, GaInAs, and AlGaInAs may be employed for forming the multi-layers in the active layer with multi-quantum-well structure. Optionally, the n-type dopant for the active layer 165 can be Si or Se. Optionally, the doping concentration can be in a range of $1.0 \times 10^{18}$ cm$^{-3}$ to $3.0 \times 10^{18}$ cm$^{-3}$. Optionally, the active layer 165 is substantially the same as the active layer 115 in a multi-layer structure and in composition of respective layer within the multi-layer structure. Optionally, both the active layer 165 and the active layer 115 are respective parts of two gain chips diced from a same die in a same wafer fabricated under a same semiconductor manufacture process.

Figure 4:
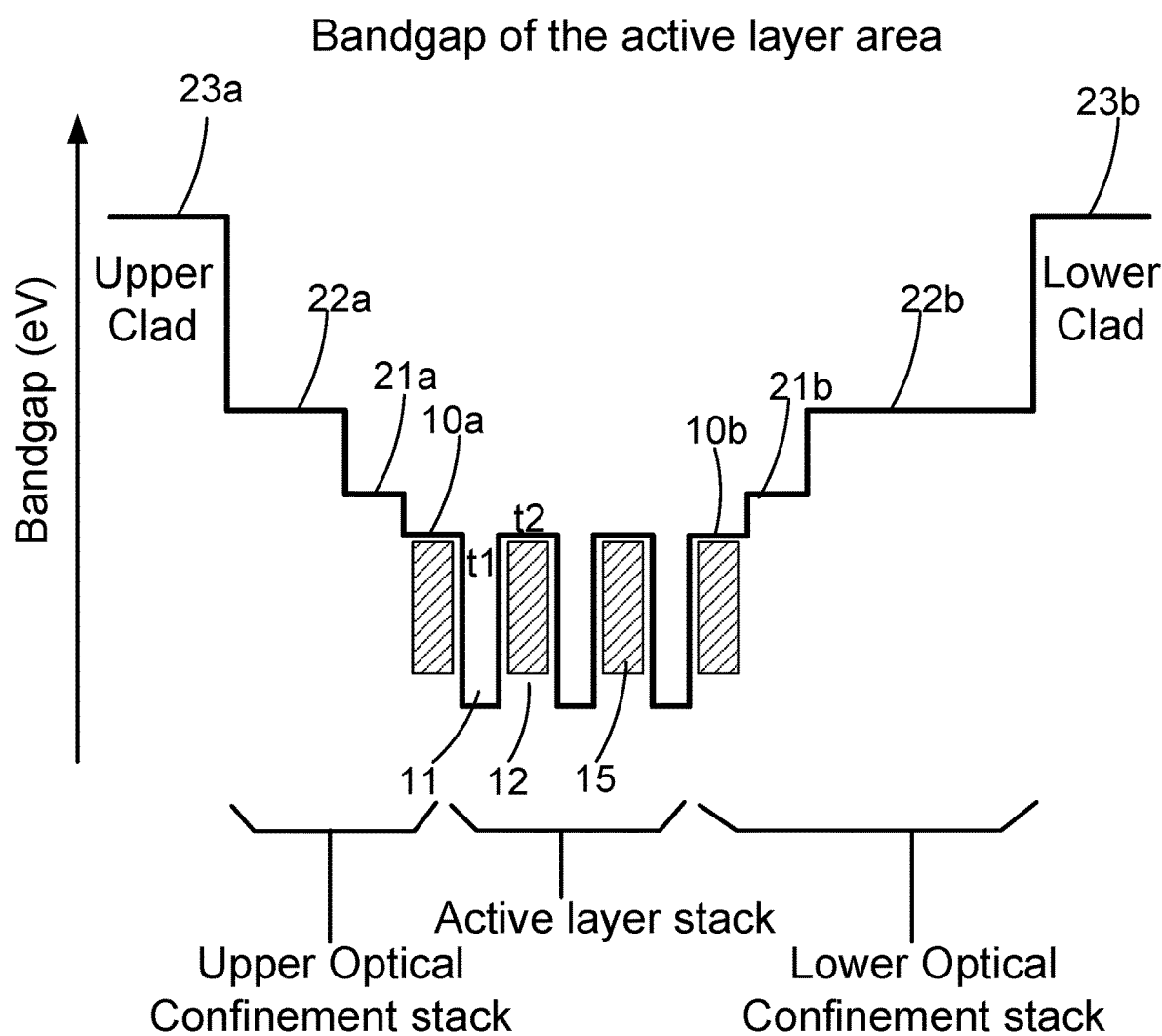
FIG. 4 is a simplified bandgap diagram of a modulated n-doped active layer in the gain medium of RSOA/SOA according to an embodiment of the present invention.

In an embodiment, the active layer 115 of RSOA or the active layer 165 of SOA is a modulated n-doped multi-quantum-well structure. The multi-quantum-well structure of the active layer provides a hetero-junction structure including multiple well layers separated by respective barrier layers to achieve high-power light wave oscillation to yield high saturation lasing power for RSOA or output power for SOA comparing to a bulk active layer. FIG. 4 is a simplified bandgap diagram of a modulated n-doped active layer in the gain medium of RSOA/SOA according to an embodiment of the present invention. This diagram is merely an example, which should not unduly limit the scope of the claims. One of ordinary skill in the art would recognize many variations, alternatives, and modifications. As shown, the active layer provides a physical stack of multilayers including multiple well layers 11 separated by respective barrier layers 12. The active layer stack is located between an upper optical confinement stack and a lower optical confinement stack. The upper optical confinement stack is further attached with an upper clad layer and the lower optical confinement stack is further attached with a lower clad layer. Optionally, the upper optical confinement stack plus the upper clad is provided as a P-layer with p-type doping characteristics as shown in FIG. 2 and FIG. 3. Optionally, the lower optical confinement stack plus the lower clad layer is provided as a N-layer with n-type doping characteristics as shown in FIG. 2 and FIG. 3. Optionally, the clad layer is selected from InP-based semiconductor material with different doping characteristics. Referring to an example shown in FIG. 4, the upper optical confinement stack includes a barrier layer 10a, two confinement layers 21a and 22a with different thicknesses and different bandgaps. The lower optical confinement stack in the example also includes a barrier layer 10b and two confinement layers 21b and 22b with different thicknesses and different bandgaps.

In an aspect, the present invention provides a gain medium with modulated n-doped active layer stack for generating high saturation power in a semiconductor amplifier such as RSOA and SOA. The specific material choices for the well layer and barrier layer, and parameters like thickness and doping characteristics are varied to yield different bandgaps and oscillation characteristics for the emitted light within the active layer stack in order to provide a specific light spectrum range that is fit, for example, for the application of the RSOA or SOA in forming a C-band or O-band wavelength tunable laser.

Referring to an embodiment shown in FIG. 4, the active layer stack is composed by three well layers 11 with a thickness t1 and a low energy bandgap of about 0.8 eV which is in a corresponding amplified wavelength range. For example, the SOA or RSOA is for amplifying wavelength in C-band. Each pair of well layers is separated by a barrier layer 12 with a thickness t2 and an energy bandgap of about 0.9-1.1 eV. Optionally, there can be two well layers. Optionally, there can be four well layers. Optionally, the well thickness is about 4-8 nm. Optionally, the barrier thickness is about 5-15 nm. Optionally, the well layer 11 is selected from an InGaP-based composite semiconductor material. Optionally, the barrier layer 12 is selected from a GaInAs-based composite semiconductor material. Optionally, the active layer stack is modulated n-doped such that the well layer 11 is undoped and the barrier layer 12 is doped by n-type impurity. Optionally, the n-type doping area 15 in the barrier layer 12 includes a width no greater than that of the barrier layer thickness t2. Optionally, the n-type doping area 15 contains Si (or Se) with a concentration in a range of $1.0 \times 10^{18}$ cm$^{-3}$ to $3.0 \times 10^{18}$ cm$^{-3}$ and a width in a range of 7 nm to 10 nm if the barrier layer is 10 nm.

Referring to FIG. 4, optionally, a barrier layer 10a (10b) is provided between the confinement layer stack and the active layer stack. Optionally, this barrier layer 10a (10b) also contains a n-doping area width, a doping concentration, and an energy bandgap all are comparable to or substantially the same as those characteristics in the barrier layer 12. Optionally, the upper confinement stack includes a first p-type confinement sublayer 21a of a thickness of about 5-15 nm same as that of the barrier layer 10a, and a bandgap of about 0.9-1.1 eV slightly higher than that of the barrier layer 10a (same as the active layer stack at about 0.9-1.1 eV) to contain the charged carrier within the active layer stack. the upper confinement stack includes a second p-type confinement sublayer 22a of a thickness of about 15-25 nm and a bandgap of about 1.1-1.2 eV higher than that of the first p-type confinement sublayer 21a to more effectively contain the charged carriers within the active layer stack for generating stimulated emission. Similarly, the lower confinement stack includes a first n-type confinement sublayer 21b of a thickness of about 5-15 nm same as that of the barrier layer 10b, and a bandgap of about 0.9-1.1 eV slightly higher than that of the barrier layer 10b (same as the active layer stack at about 1 eV). Further, the lower confinement stack also includes a second p-type confinement sublayer 22b of a thickness of about 38 nm and a bandgap of about 1.1-1.2 eV. Referring to FIG. 4, the upper clad has an even higher bandgap of about 1.3-1.4 eV. Optionally, the upper clad is InP doped with p-type dopant. The lower clad also has a bandgap of about 1.3-1.4 eV and made by InP doped with n-type dopant.

In the embodiment to implement the modulated n-doped active layer stack in the gain medium for RSOA or SOA to reduce carrier lifetime without increasing differential gain for achieving higher saturation power [see expression (1)]. At the same time, the gain of the gain medium containing the modulated n-doped active layer stack is kept high enough to have the RSOA or SOA device to operate at lower injected current with smaller cavity length so that the device can be operated at elevated temperature of 50° C. or higher.

Figure 5:
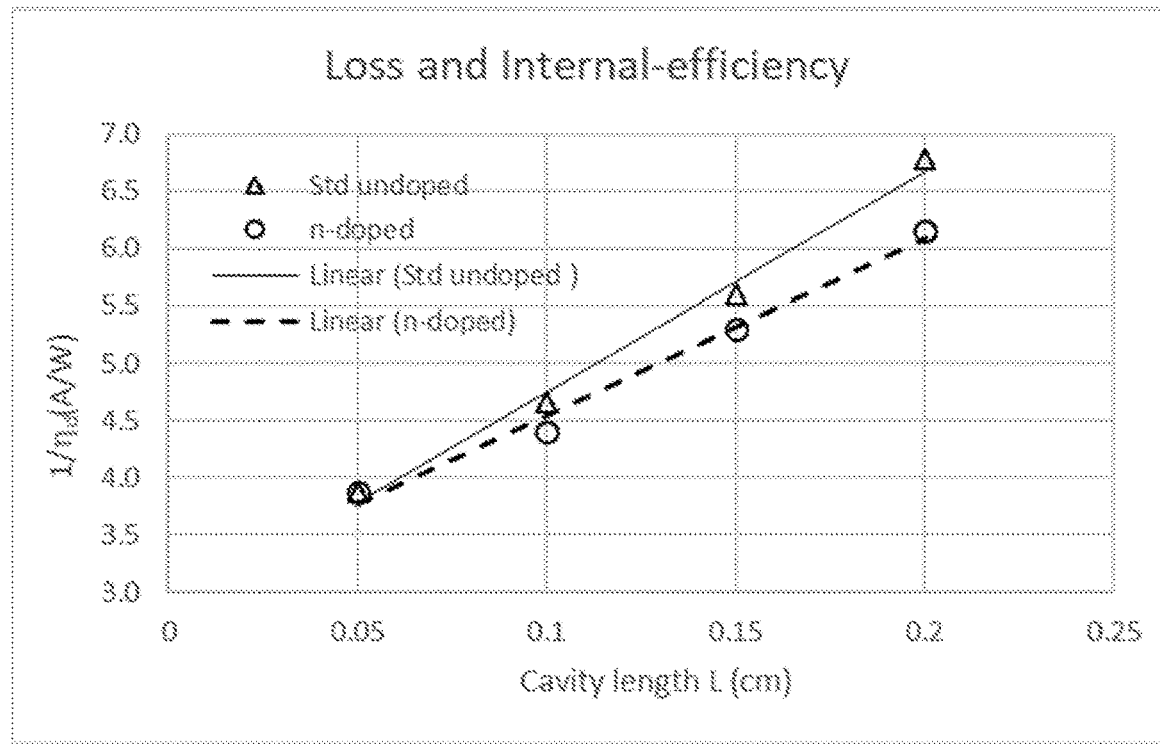
FIG. 5 is a graph showing the relation between the reciprocal of internal efficiency and cavity length of a gain medium with/without n-doped active layer in a nominal optical cavity according to an embodiment of the present invention.

FIG. 5 is a graph showing the relation between the reciprocal of internal efficiency and cavity length of a gain medium with/without n-doped active layer in a nominal optical cavity according to an embodiment of the present invention. This diagram is merely an example, which should not unduly limit the scope of the claims. One of ordinary skill in the art would recognize many variations, alternatives, and modifications. As shown, the reciprocal of external differential quantum efficiency and is plotted against cavity length of a gain medium for either a conventional un-doped active layer stack (Δ) or a modulated n-doped active layer stack (O). These data are collected from cavity length varied from 0.05 cm to 0.2 cm. The solid line and the dashed line are respective linear fit lines for the two sets of data. The internal loss is calculated from the gradient of each straight line (solid or dashed). Apparently, the modulated n-doped active layer yields a lower loss (see Table 1 below) compared to the case with the un-doped active layer. In consequence, the internal losses of the gain medium without and with the n-doped active layer stack were estimated at 8.96 cm$^{-1}$ and 6.77 cm$^{-1}$, respectively. This indicates that the internal efficiency can be improved for achieving higher output power by modulation doping with the n-type dopant in the active layer stack of the gain medium.

TABLE I

| Wafer | T (° C.) | Loss cm$^{-1}$ | $\eta_i$ (%) | $G_0$ cm$^{-1}$ | $J_{tr}$ mA/cm |
|---|---|---|---|---|---|
| Std | 25 | 8.96 | 0.89 | 14.42 | 41.73 |
| n-doped | 25 | 6.77 | 0.84 | 11.12 | 27.21 |

Figure 6:
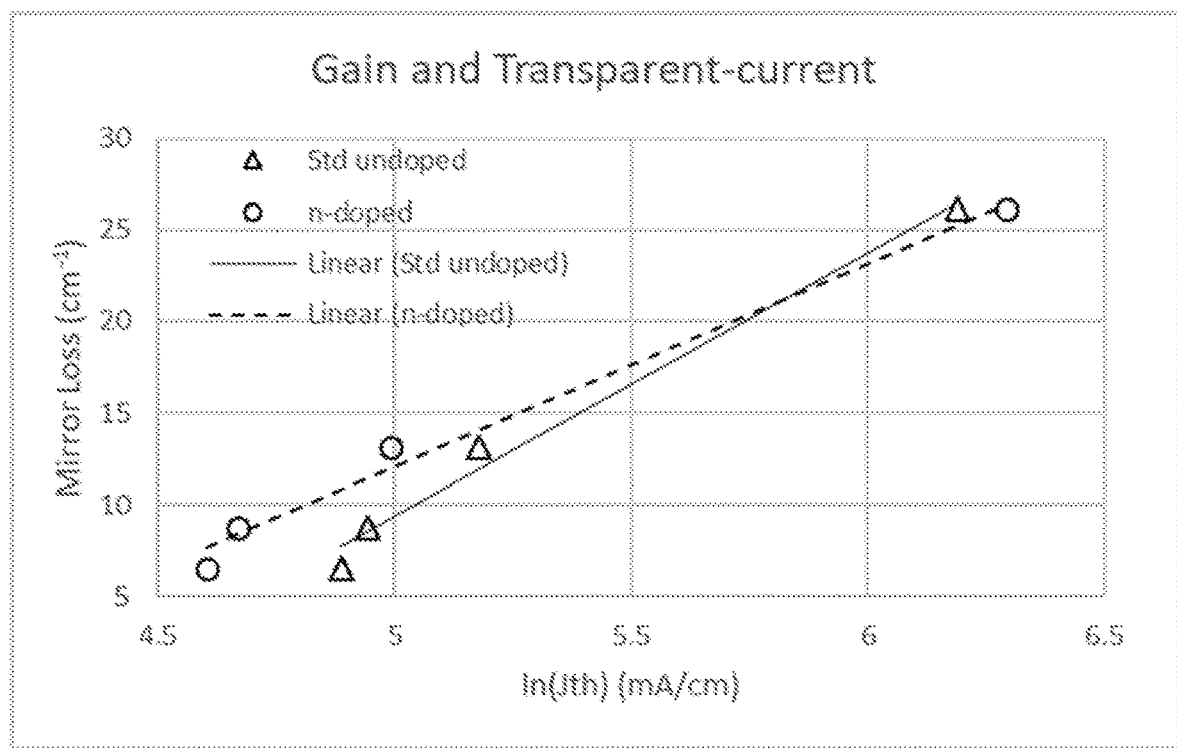
FIG. 6 is a graph showing the relation between mirror loss and transparent current density of a gain medium with/without n-doped active layer in a nominal cavity according to an embodiment of the present invention.

FIG. 6 is a graph showing the relation between mirror loss and transparent current density of a gain medium in a nominal optical cavity according to an embodiment of the present invention. This diagram is merely an example, which should not unduly limit the scope of the claims. One of ordinary skill in the art would recognize many variations, alternatives, and modifications. In additional to the internal loss, the gain medium, as it is applied in a nominal optical cavity, also has a mirror loss depending on reflectance values of two facets thereof. As shown, the mirror loss of the gain medium in a nominal optical cavity (with about 27% reflectivity) containing an undoped active layer stack (Δ) or a modulated n-doped active layer stack (O) is plotted against the logarithm of a threshold current density. The solid line and the dashed line are respective linear fit lines for the two sets of data. The threshold gain $G_0$ of the gain medium is calculated from the gradient of each straight line (solid or dashed), showing that $G_0$ is slightly lowered from 14.42 (cm$^{-1}$) to 11.12 (cm$^{-1}$) (see Table I above). A lower threshold gain value of the gain medium leads to a lower differential gain. Based on expression (1), lower differential gain results in higher saturation power of the gain medium can produce, which translates to a higher lasing power as the gain medium is in a RSOA device and a higher maximum output power as the gain medium is in a SOA device, and combined, a higher output power for the tunable laser based on the RSOA and SOA. Based on the graph of FIG. 6, a transparent current density $J_{tr}$ can be obtained as the current density at cavity length of infinity, or the mirror loss equals zero. The results of Table I indicate that the transparent current density $J_{tr}$ is lowered a lot at about 27 mA/cm$^2$ for the gain medium with n-doped active layer stack compared to about 42 mA/cm$^2$ for the gain medium with undoped active layer stack. Lower transparent current density means lower carrier lifetime, which yields higher saturation power as shown in the expression (1).

Yet, for a slightly lower $G_0$ around 11 cm$^{-1}$, the chip gain for either a RSOA or SOA device with the gain medium as described in a typical 1 mm cavity length can be still at least 20 dB (at room temperature) with a nominal operating current of about 300 mA. This ensures a high saturation power of at least 15 dBm when the ROSA or SOA device is operated at elevated temperature of about 50° C. There is no need to extend the cavity length or hike the injection current in order to achieve high enough gain especially at the elevated temperature environment. Additionally, the gain medium with the modulated n-doped active layer stack being applied in the RSOA device or SOA device has much higher mirror loss than typical laser device due to the facet reflectance setting of the gain medium cavity given a similar cavity length. For a RSOA device with a gain medium in a 1 mm long cavity having one HR facet with >90% in reflectance and one AR facet with about 0.005% in reflectance, a mirror loss is about 49.5 cm$^{-1}$. For a SOA device with a gain medium in a 1 mm long cavity having both AR facets, the mirror loss is about 90 cm$^{-1}$ or greater.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A passthrough semiconductor optical amplifier configured to amplify laser light generated by a laser for data communication, the passthrough semiconductor optical amplifier being downstream from the laser and comprising:
   a front facet having a first anti-reflective coating, a first reflectance less than or equal to 0.005%, and configured to receive the laser light from the laser;
   a back facet having a second anti-reflective coating and a second reflectance less than or equal to 0.005%, the first anti-reflective coating and the second anti-reflective coating allowing the laser light to pass through the passthrough semiconductor optical amplifier once and be amplified by the passthrough semiconductor optical amplifier; and
   a first gain medium i) extending from the front facet to the back facet, ii) in combination with the front facet and the back facet exhibiting a mirror loss to amplify the laser light for data communication, and iii) comprising a multilayer structure, the mirror loss being between 40 and 200 cm$^{-1}$ in accordance with $\alpha_m = (\frac{1}{2}L)\ln\{1/(Rf \times Rb)\}$, where Rf is the first reflectance of the front facet and Rb is the second reflectance of the back facet, and the multilayer structure comprising
   a P-layer,
   an N-layer,
   an N-doped active layer disposed between the P-layer and the N-layer and having undoped well layers, and N-doped barrier layers alternating with the undoped well layers between the P-layer and the N-layer, the N-doped barrier layers having a width between 5 and 15 nm, and the undoped well layers having a width between 4 and 8 nm.

2. The passthrough semiconductor optical amplifier of claim 1, wherein the N-doped active layer is configured to provide saturation power of at least 15 dBm with an operation temperature up to 50° C. for the first gain medium.

3. The passthrough semiconductor optical amplifier of claim 1, wherein the N-doped barrier layers have a bandgap between 0.9 and 1.1 eV.

4. The passthrough semiconductor optical amplifier of claim 3, wherein each of the N-doped barrier layers comprises a modulation doping area with an N-type dopant concentration range of 1.0×10$^{18}$ cm$^{-3}$ to 3.0×10$^{18}$ cm$^{-3}$ in a width range of 7 nm to 10 nm based on a barrier layer width of 10 nm.

5. The passthrough semiconductor optical amplifier of claim 1, wherein the undoped well layers have a bandgap of 0.8 eV.

6. The passthrough semiconductor optical amplifier of claim 1, wherein the first gain medium is configured as an optical cavity for amplifying the laser light in the N-doped active layer, and wherein the laser light is input through the back facet once and emitted through the front facet once.

7. The passthrough semiconductor optical amplifier of claim 6, wherein:
   the N-doped active layer is configured as a waveguide through the optical cavity of the first gain medium; and
   the waveguide is arranged at a non-perpendicular angle relative to the front facet and a non-perpendicular angle relative to the back facet.

8. The passthrough semiconductor optical amplifier of claim 1, wherein the P-layer comprises a P-type confinement layer attached to an upper portion of the N-doped active layer and a P-type clad layer attached to a side of the P-type confinement layer more distal to the N-doped active layer than the P-type confinement layer.

9. The passthrough semiconductor optical amplifier of claim 8, wherein the P-type confinement layer comprises (i) a first confinement sublayer having a thickness between 5 and 15 nm with a bandgap between 0.9 and 1.1 eV attached to a barrier layer with a bandgap between 0.9 and 1.1. eV next to the upper portion of the N-doped active layer and (ii) a second confinement sublayer having a thickness between 15 and 25 nm and a bandgap between 1.1 and 1.2 eV attached to a side of the first confinement sublayer more distal to the N-doped active layer than the first confinement sublayer.

10. The passthrough semiconductor optical amplifier of claim 1, wherein the N-layer comprises an N-type confinement layer attached to a lower portion of the N-doped active layer and an N-type clad layer attached to a side of the N-type confinement layer more distal to the N-doped active layer than the N-type confinement layer.

11. The passthrough semiconductor optical amplifier of claim 10, wherein the N-type confinement layer comprises (i) a first confinement sublayer having a thickness between 5 and 15 nm with a bandgap between 0.9 and 1.1 eV attached to a barrier layer with a bandgap between 0.9 and 1.1 eV next to the lower portion of the N-doped active layer and (ii) a second confinement sublayer having a thickness between 15 and 80 nm and a bandgap between 1.1 and 1.2 eV attached to a side of the first confinement sublayer more distal to the N-doped active layer than the first confinement sublayer.

12. A tunable laser module comprising:
the passthrough semiconductor optical amplifier ref claim 1; and
the laser comprising a reflective semiconductor optical amplifier, the reflective semiconductor optical amplifier configured to generate the laser light and comprising
a front facet having an anti-reflective coating and configured to output the laser light,
a back facet having a reflective coating and configured to reflect the laser light to the front facet, and
a second gain medium i) extending from the front facet of the reflective semiconductor optical amplifier to the back facet of the reflective semiconductor optical amplifier, ii) in combination with the front facet and the back facet of the reflective semiconductor optical amplifier exhibiting a second mirror loss to amplify the laser light for data communication, and iii) comprising a second multilayer structure, the second multilayer structure comprising
a P-layer,
an N-layer,
an N-doped active layer disposed between the P-layer of the second gain medium and the N-layer of the second gain medium and having undoped well layers, and
N-doped barrier layers alternating with the undoped well layers of the N-doped active layer of the second gain medium between the P-layer of the second gain medium and the N-layer of the second gain medium.

13. The tunable laser module of claim 12, further comprising:
a wavelength tuner configured to receive, via a first waveguide, the laser light output from the reflective semiconductor optical amplifier, and to tune a wavelength of the laser light; and
a wavelength locker configured to lock the wavelength of the laser light as tuned by the wavelength tuner and provide, via a second waveguide, the laser light to the passthrough semiconductor optical amplifier.

14. The passthrough semiconductor optical amplifier of claim 12, wherein:
the second mirror loss is greater than 45 cm$^{-1}$;
a length of the second gain medium is 1 mm; and
a reflectance of the back facet of the reflective semiconductor optical amplifier is greater than 90%.

15. The tunable laser module of claim 12, wherein:
the N-doped active layer of the reflective semiconductor optical amplifier is configured as a waveguide through an optical cavity of the second gain medium; and
the waveguide is arranged at a non-perpendicular angle relative to the front facet of the reflective semiconductor optical amplifier and a perpendicular angle relative to the back facet of tine reflective semiconductor optical amplifier.

16. A tunable laser module comprising:
a laser configured to generate laser light, the laser comprising a reflective semiconductor optical amplifier (RSOA), the RSOA configured to reflect and emit the laser light, the RSOA comprising
a first front facet having an anti-reflective coating, a reflectance less than or equal to 0.005%, and configured to output the laser light,
a first back facet having a reflective coating, a reflectance greater than 90%, and configured to reflect the laser light to the first front facet, and
a first gain medium i) extending from the first front facet to the first back facet, ii) in combination with the first front facet and the first back facet exhibiting a first mirror loss to amplify the laser light for data communication, and iii) comprising a multilayer structure, the first mirror loss being 45-100 cm$^{-1}$ in accordance with $\alpha_{m1}=(\frac{1}{2}L)\ln\{1/(Rf \times Rb)\}$, where Rf is the reflectance of the first front facet and Rb is the reflectance of the first back facet, the multilayer structure comprising
a first P-layer,
a first N-layer,
a first N-doped active layer disposed between the first P-layer and the first N-layer and having undoped well layers, and
first N-doped barrier layers alternating with the undoped well layers between the first P-layer and the first N-layer; and
a passthrough semiconductor optical amplifier (SOA) separate from the laser and configured to receive and amplify the laser light emitted from the RSOA, the passthrough SOA comprising
a second front facet having an anti-reflective coating and a reflectance less than or equal to 0.005%,
a second back facet having an anti-reflective coatingnd a reflectance less than or equal to 0.005%, the anti-reflective coating of the second front facet and the anti-reflective coating of the second back facet allowing the laser light to pass through the passthrough SOA once and be amplified by the passthrough SOA, and
a second gain medium i) extending from the second front facet to the second back facet, ii) in combination with the second front facet and the second back facet exhibiting a second mirror loss to further amplify the laser light for data communication, and iii) comprising a multilayer structure, the second mirror loss being between 40 and 200 cm$^{-1}$ in accordance with $\alpha_{m2}=(\frac{1}{2}L)\ln\{1/(Rf2 \times Rb2)\}$, where Rf2 is a reflectance of the second front facet and Rb2 is a reflectance of the second back facet, and the multilayer structure of the second gain medium comprising
a second P-layer,
a second N-layer,
a second N-doped active layer disposed between the second P-layer and the second N--layer and having undoped well layers, and
second N-doped barrier layers alternating with the undoped well layers between the second P-layer and the second N-layer.

17. The tunable laser module of claim 16, further comprising a wavelength tuner configured to receive, via a first waveguide, the laser light emitted from the RSOA and tune a wavelength of the laser light.

18. The tunable laser module of claim 17, further comprising a wavelength locker configured to lock the wavelength of the laser light as tuned by the wavelength tuner and provide, via a second waveguide, the laser light to the passthrough SOA.

19. The tunable laser module of claim 18, further comprising a silicon photonics substrate,
wherein the RSOA, the passthrough SOA, the wavelength tuner, and the wavelength locker are disposed on the silicon photonics substrate.

20. The tunable laser module of claim 16, wherein:
a length of the first gain medium is 1 mm; and
a length of the second gain medium is 1 mm.

21. The tunable laser module of claim 16, wherein:
the second N-doped barrier layers have a width between 5 and 15 nm; and
the undoped well layers of the second N-doped active layer have a width between 4 and 8 nm.

22. The tunable laser module of claim 16, wherein:
the second N-doped barrier layers have a bandgap between 0.9 and 1.1 eV; and
the undoped well layers of the second N-doped active layer have a bandgap of 0.8 eV.

23. The tunable laser module of claim 16, wherein:
the second N-doped barrier layers have a width between 5 and 15 nm and a bandgap between 0.9 and 1.1 eV; and
the undoped well layers of the second N-doped active layer have a width between 4 and 8 nm and a bandgap of 0.8 eV.

* * * * *